US008141965B2

(12) United States Patent
Nelson et al.

(10) Patent No.: US 8,141,965 B2
(45) Date of Patent: *Mar. 27, 2012

(54) L-SHAPED DOOR WITH THREE-SURFACE SEAL FOR ENDPLATES

(75) Inventors: Michael J. Nelson, Prior Lake, MN (US); Michael J. Wayman, Waconia, MN (US); Kevin Thompson, Chaska, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 333 days.

This patent is subject to a terminal disclaimer.

(21) Appl. No.: 12/474,933

(22) Filed: May 29, 2009

(65) Prior Publication Data

US 2009/0307983 A1  Dec. 17, 2009

Related U.S. Application Data

(60) Provisional application No. 61/060,523, filed on Jun. 11, 2008.

(51) Int. Cl.
*A47B 95/00* (2006.01)
(52) U.S. Cl. ...................................... 312/296; 312/223.1
(58) Field of Classification Search .......... 312/326–329, 312/296, 223.1, 100, 236; 49/490.1, 475.1; 277/630, 637, 644, 647, 921
See application file for complete search history.

(56) References Cited

U.S. PATENT DOCUMENTS

| | | | | |
|---|---|---|---|---|
| 2,226,615 A | * | 12/1940 | Killen | 49/462 |
| 2,704,688 A | * | 3/1955 | Adell | 49/462 |
| 2,740,658 A | * | 4/1956 | Kesich | 49/462 |
| 3,371,447 A | * | 3/1968 | Ruff et al. | 49/490.1 |
| 3,894,767 A | * | 7/1975 | Schatzler et al. | 296/213 |
| 3,987,655 A | | 10/1976 | Myotte | |
| 4,308,742 A | | 1/1982 | Harrison et al. | |
| 4,371,757 A | | 2/1983 | Debortoli et al. | |
| 4,549,602 A | | 10/1985 | Espinoza | |
| 4,742,864 A | | 5/1988 | Duell et al. | |
| 4,861,077 A | | 8/1989 | Welkey | |
| 5,157,577 A | | 10/1992 | Balaud | |
| 5,267,762 A | | 12/1993 | Gromotka | |
| 5,383,722 A | * | 1/1995 | Chen | 312/9.55 |
| 5,445,787 A | | 8/1995 | Friedman et al. | |
| 5,465,528 A | * | 11/1995 | Schinzel et al. | 49/368 |
| 5,490,408 A | | 2/1996 | Ando et al. | |
| 5,548,085 A | * | 8/1996 | Flores | 174/374 |
| 5,710,804 A | | 1/1998 | Bhame et al. | |
| 5,713,647 A | | 2/1998 | Kim | |
| 5,806,948 A | | 9/1998 | Rowan, Sr. et al. | |
| 5,894,407 A | | 4/1999 | Aakalu et al. | |
| 5,905,244 A | | 5/1999 | Smith | |
| 6,039,414 A | | 3/2000 | Melane et al. | |
| 6,065,612 A | | 5/2000 | Rinderer | |
| 6,082,441 A | | 7/2000 | Boehmer et al. | |

(Continued)

*Primary Examiner* — Janet M Wilkens
(74) *Attorney, Agent, or Firm* — Fogg & Powers LLC

(57) ABSTRACT

A water-resistant and electromagnetic interference shielded enclosure configured to enclose a plurality of electronic components is provided. The enclosure comprises a base having a channel, a first L-shaped door rotatably attached to a first side edge of the base, a second L-shaped door rotatably attached to a second side edge of the base, a door-to-door seal abutted to a flange on the first L-shaped door, and a compressible base-seal inserted into the channel. The compressible base-seal and the door-to-door seal form a three-surface seal when the first L-shaped door and the second L-shaped door are closed.

19 Claims, 14 Drawing Sheets

U.S. PATENT DOCUMENTS

| | | |
|---|---|---|
| 6,116,615 A | 9/2000 | Trehan |
| 6,142,595 A | 11/2000 | Dellapi et al. |
| 6,229,707 B1 | 5/2001 | Keenan |
| 6,238,027 B1 | 5/2001 | Kohler et al. |
| 6,253,834 B1 | 7/2001 | Sterner |
| 6,280,232 B1 | 8/2001 | Beecher et al. |
| 6,299,008 B1 * | 10/2001 | Payne .......................... 220/1.5 |
| 6,340,317 B1 | 1/2002 | Lin |
| 6,359,218 B1 | 3/2002 | Koch et al. |
| 6,452,810 B1 | 9/2002 | Wilcox |
| 6,465,561 B1 | 10/2002 | Yarbrough et al. |
| 6,469,911 B1 | 10/2002 | Brown et al. |
| 6,512,669 B1 | 1/2003 | Goodwin |
| 6,564,428 B2 * | 5/2003 | Richard et al. .................. 16/366 |
| 6,579,029 B1 | 6/2003 | Sevde et al. |
| 6,621,712 B2 | 9/2003 | Siira |
| 6,788,535 B2 | 9/2004 | Dodgen |
| 6,968,647 B2 | 11/2005 | Levesque et al. |
| 7,032,277 B2 | 4/2006 | Rolla et al. |
| 7,068,516 B2 | 6/2006 | Chan |
| 7,225,586 B2 | 6/2007 | Levesque et al. |
| 7,450,382 B1 | 11/2008 | Fischer |
| 7,457,123 B1 | 11/2008 | Wayman |
| 7,495,169 B2 | 2/2009 | Adducci |
| 2003/0016515 A1 | 1/2003 | Jackson |
| 2003/0031002 A1 | 2/2003 | Siira |
| 2003/0102141 A1 * | 6/2003 | Schneider et al. .............. 174/50 |
| 2004/0112623 A1 | 6/2004 | L'Henaff et al. |
| 2004/0114326 A1 * | 6/2004 | Dodgen et al. ................ 361/694 |
| 2004/0121132 A1 | 6/2004 | Slyne |
| 2006/0158866 A1 | 7/2006 | Peterson |
| 2006/0279927 A1 | 12/2006 | Strohm |
| 2007/0247809 A1 | 10/2007 | McClure |
| 2008/0235907 A1 | 10/2008 | Wayman et al. |
| 2008/0237420 A1 | 10/2008 | Wayman et al. |
| 2008/0238270 A1 | 10/2008 | Wayman et al. |
| 2008/0239632 A1 | 10/2008 | Wayman |
| 2008/0239669 A1 | 10/2008 | Wayman |
| 2008/0239673 A1 | 10/2008 | Wayman |
| 2008/0239688 A1 | 10/2008 | Casey et al. |
| 2008/0240164 A1 | 10/2008 | Zavadsky |
| 2008/0240225 A1 | 10/2008 | Zavadsky et al. |
| 2008/0241571 A1 | 10/2008 | Wayman et al. |
| 2008/0242232 A1 | 10/2008 | Zavadsky et al. |
| 2008/0245938 A1 | 10/2008 | Qualy et al. |
| 2008/0278912 A1 | 11/2008 | Zavadsky et al. |
| 2008/0318631 A1 | 12/2008 | Baldwin |

* cited by examiner

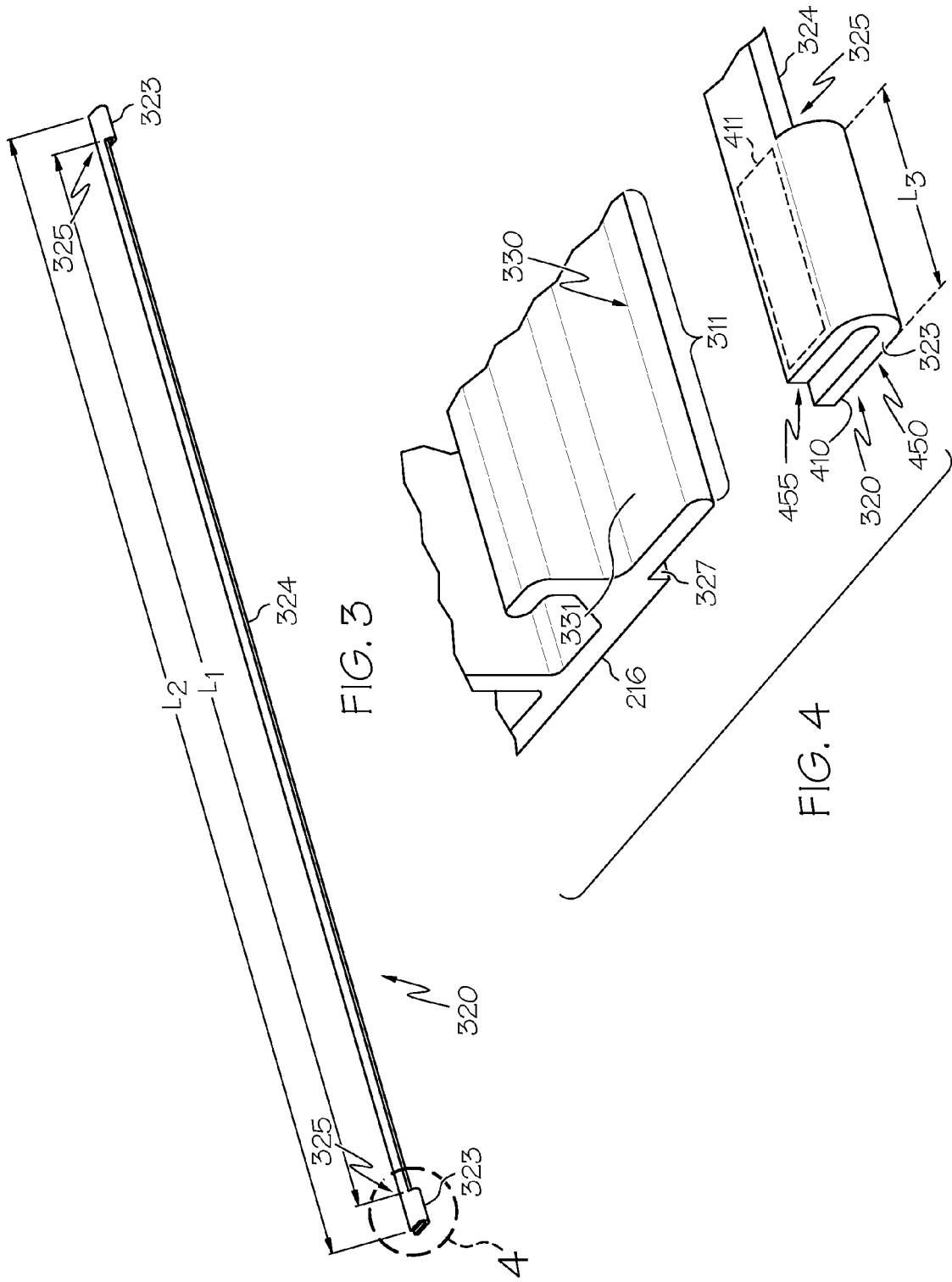

L-SHAPED DOOR WITH THREE-SURFACE SEAL FOR ENDPLATES

This application claims the benefit of U.S. Provisional Application No. 61/060,523 filed on Jun. 11, 2008, which is incorporated herein by reference in its entirety.

CROSS REFERENCE TO RELATED APPLICATIONS

This application is related to the following co-pending U.S. patent applications filed on even date with the U.S. Provisional Application No. 61/060,523, all of which are hereby incorporated herein by reference:

U.S. patent application Ser. No. 12/137,307, titled "ANGLED DOORS WITH CONTINUOUS SEAL" and which is referred to here as the '307 Application;

U.S. patent application Ser. No. 61/060,576, titled "L-SHAPED DOORS WITH TRAPEZOIDAL SEAL" and which is referred to here as the '576 Application;

U.S. patent application Ser. No. 61/060,547, titled "COMBINATION EXTRUDED AND CAST METAL OUTDOOR ELECTRONICS ENCLOSURE" and which is referred to here as the '547 Application;

U.S. patent application Ser. No. 61/060,584, titled "SYSTEMS AND METHODS FOR CABLE MANAGEMENT" and which is referred to here as the '584 Application;

U.S. patent application Ser. No. 12/137,322, titled "COMMUNICATION MODULES" and which is referred to here as the '322 Application; and U.S. patent application Ser. No. 61/060,581, titled "CAM SHAPED HINGES" and which is referred to here as the '581 Application.

BACKGROUND

In a communications system, such as a distributed antenna system and/or telecommunications infrastructure equipment, it is often necessary to place a remote unit in an outdoor area. For example, a remote unit may be placed in an outdoor stadium, park, etc. Placing a remote unit outdoors potentially exposes the unit to adverse weather conditions, such as rain, wind, etc. In order to protect the electronic components of the remote unit, the electronic components are typically placed in an enclosure which is sealed to be water-resistant. While enclosures protect the electronic components, conventional enclosures also make it difficult to access the components during installation or maintenance by blocking or providing small access areas to one or more sides of the electronic components.

In some cases, the telecommunications infrastructure equipment, which is housed in the outdoor electronic enclosures, emit electromagnetic fields that can cause electromagnetic interference (EMI) with electronic devices external to the outdoor electronic enclosures. Likewise, electromagnetic fields emitted by electronic devices external to the outdoor electronic enclosure can interfere with the telecommunications infrastructure equipment housed in the enclosure.

SUMMARY

A water-resistant and electromagnetic interference shielded enclosure configured to enclose a plurality of electronic components is provided. The enclosure comprises a base having a channel, a first L-shaped door rotatably attached to a first side edge of the base, a second L-shaped door rotatably attached to a second side edge of the base, a door-to-door seal abutted to a flange on the first L-shaped door, and a compressible base-seal inserted into the channel. The compressible base-seal and the door-to-door seal form a three-surface seal when the first L-shaped door and the second L-shaped door are closed.

DRAWINGS

FIG. 3 is a view of one embodiment of a door-to-door seal.

FIG. 4 is an enlarged view of a portion of the door-to-door seal of FIG. 3.

In accordance with common practice, the various described features are not drawn to scale but are drawn to emphasize features relevant to the present invention. Like reference characters denote like elements throughout figures and text.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that mechanical and structural changes may be made without departing from the scope of the present invention. The following detailed description is, therefore, not to be taken in a limiting sense.

For the reasons stated above and for other reasons stated below which will become apparent to those skilled in the art upon reading and understanding the specification, there is a need in the art for improved systems and methods that permit easy access to electronic equipment housed in water-resistant outdoor electronic enclosures and that prevent leakage of interfering electromagnetic fields from the electronic equipment housed in the outdoor electronic enclosure.

Figure 1:
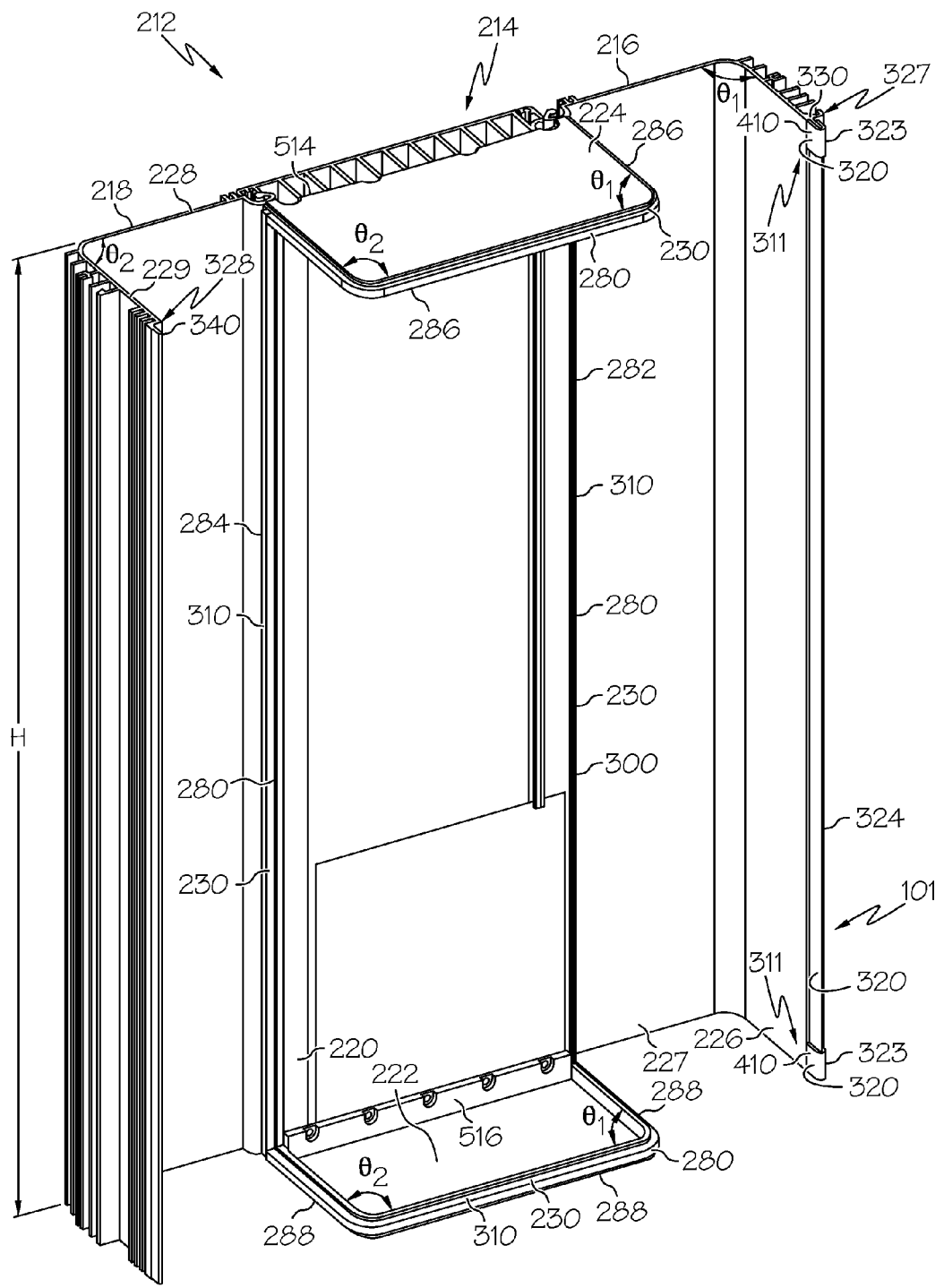
FIG. 1 is an oblique view of one embodiment of a first L-shaped door and a second L-shaped door attached to a base in an open position.

FIG. 1 is an oblique view of one embodiment of a first L-shaped door 216 and a second L-shaped door 218 attached to a base 214 in an open position. The base 214 includes a back wall 220, a first endplate 224, and a second endplate 222. The first L-shaped door 216 is rotatably attached to a first side edge 282 of the back wall 220. The second L-shaped door 218 is rotatably attached to a second side edge 284 of the back wall 220. A door-to-door seal 320 is abutted to a flange 330 (also referred to herein as "first flange 330") formed along an outer edge 327 of the first L-shaped door 216. A second flange 340 is formed along an outer edge 328 of the second L-shaped door 218. The first and second flanges 330 and 340 extend along the length H of the first and second L-shaped doors 216 and 218, respectively. The phrase "abutted to a flange" is also referred to herein as "secured to a flange" or "attached to a flange." In embodiments described herein, the door-to-door seal is abutted to a flange by adhesives or by structural configurations that mate the door-to-door seal to the flange.

A continuous channel 230 (also referred to herein as "channel 230") is formed along the exposed perimeter of base 214. When closed, the first L-shaped door 216 and second L-shaped door 218 abut the exposed perimeter 280 of base 214 in order to form the sealed, water-resistant enclosure 212. As defined herein, the exposed perimeter 280 of base 214 refers to the side edge 282 of back wall 220 that is adjacent to the first L-shaped door 216 in which a first portion of the channel 230 is formed, the edge 286 of second endplate 222 that does not abut the back wall 200 in which a second portion of the channel 230 is formed, side edge 284 of back wall 220 that is adjacent to the second L-shaped door 218 in which a third portion of the channel 230 is formed, and the edge 288 of the first endplate 224 that does not abut the back wall 220 in which a fourth portion of the channel 230 is formed. The first, second, third and fourth portions of the channel 230 together form a continuous channel 230. The exposed perimeter 280 of base 214 is completely exposed when the first L-shaped door and the second L-shaped door are attached to the base 214 in an open position as shown in FIG. 1.

Figure 8:
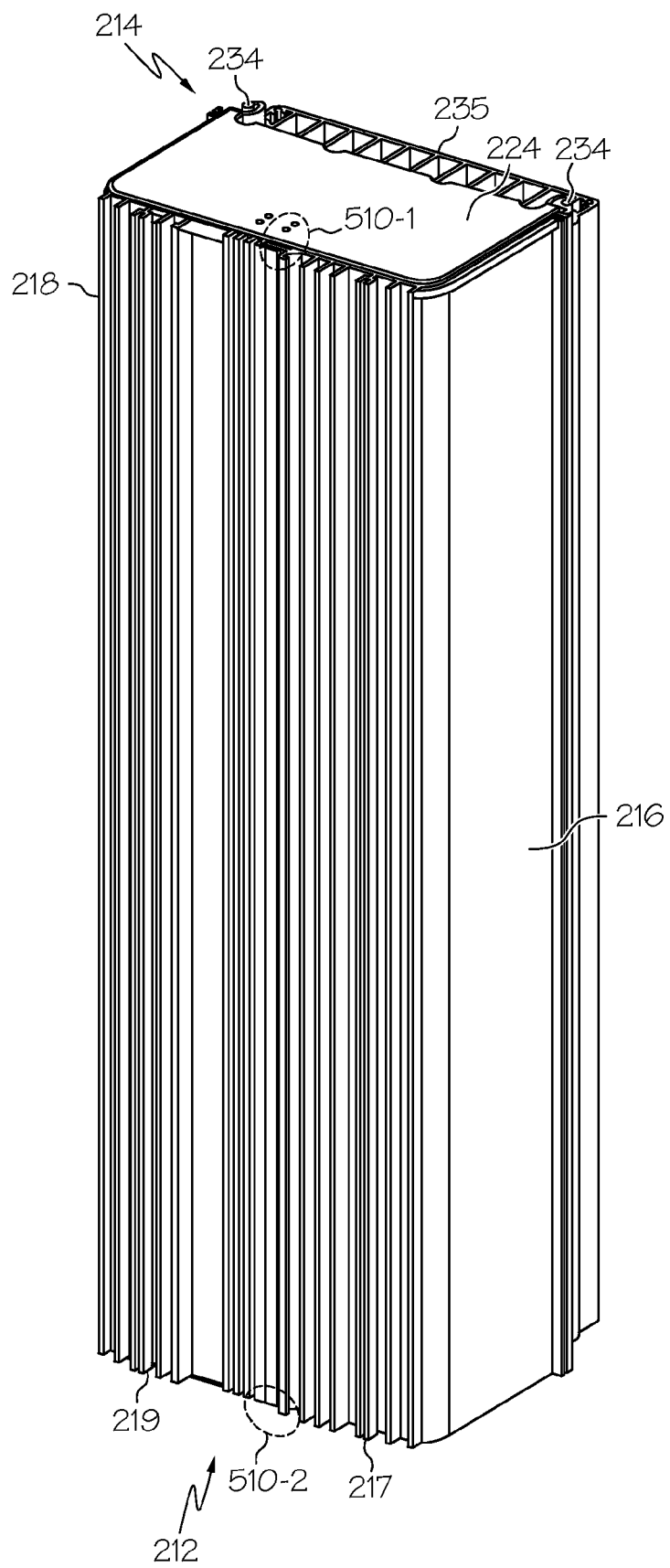
FIG. 8 is an oblique view of one embodiment of a first L-shaped door and a second L-shaped door attached to a base in a closed position.

The continuous channel 230 is configured to hold a compressible base-seal 300. The first L-shaped door 216, the second L-shaped door 218, the base 214, the door-to-door seal 320, and the compressible base-seal 300 together form a water-resistant and electromagnetic interference (EMI) shielded enclosure 212 configured to enclose a plurality of electronic components when the first L-shaped door 216 and the second L-shaped door 218 are closed as is shown in FIG. 8. The compressible base-seal 300 and the door-to-door seal 320 together comprise a water-resistant seal system 101 for the enclosure 212 to prevent water from entering the closed enclosure 212 (FIG. 8). When in the open position, the enclosure provides easy access to the electronic components housed therein.

Figure 2:
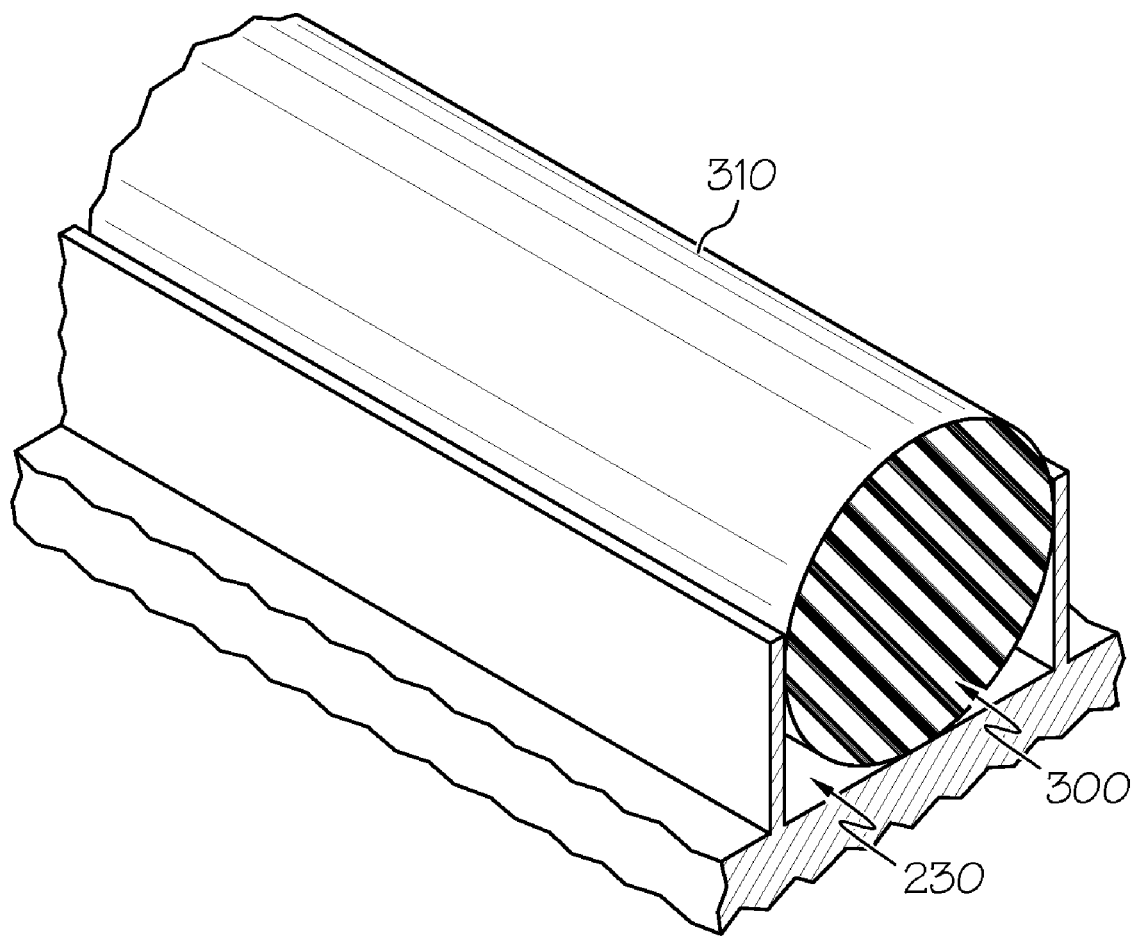
FIG. 2 is an enlarged view of an embodiment of a compressible base-seal in a channel.

FIG. 2 is an enlarged view of an embodiment of a compressible base-seal 300 inserted in the channel 230. The compressible base-seal 300 includes a contacting surface 310 that protrudes from the channel 230. When placed under pressure, the compressible base-seal 300 is compressed within the channel 230 so that a portion of the contacting surface 310 remains external to the channel 230.

FIG. 3 is a view of one embodiment of a door-to-door seal 320. FIG. 4 is an enlarged view of a portion of the door-to-door seal 320 of FIG. 3 shown in relation to the flange 330. The door-to-door seal 320 includes two wrap-around-flange sections 323 at the ends 325 of an inside-door-to-door seal section 324. Each of the wrap-around-flange sections 323 (also referred to herein as "end sections 323") has an inner portion represented generally at 450 and an outer portion represented generally at 455. The wrap-around-flange sections 323 are U-shaped to mate with ends 311 (FIG. 1) of the first flange 330 to abut the door-to-door seal 320 to the flange 330. When mated with ends 311, the two wrap-around-flange sections 323 secure the inside-door-to-door seal section 324 to the outer surface 331 of the first flange 330. As defined herein, the outer surface 331 of the first flange 330 faces away from the back wall 220 of the base 214 when the first L-shaped door 216 is in the closed position. When the door-to-door seal 320 is attached to the first flange 330, the outer portions 455 and the inside-door-to-door seal section 324 of the door-to-door seal 320 overlay the outer surface 331 (FIG. 4) of the first flange 330. The surfaces 410 (shown clearly in FIG. 1) are the surfaces of inner portions 450 of the wrap-around-flange sections 323 that face toward the back wall 220 when the first L-shaped door 216 is closed. The surfaces 411 are the surfaces of outer portions 155 of the wrap-around-flange sections 323 that face away from the back wall 220 when the first L-shaped door 216 is closed.

The inside-door-to-door seal section 324 has a length $L_1$. Each wrap-around-flange section 323 has a length $L_3$. The length of the door-to-door seal 320 is $L_2$, which is equal to $L_1+2L_3$. The length $L_2$ is equal to the height H (FIG. 1) of the first L-shaped door 216 and second L-shaped door 218.

Figure 5:
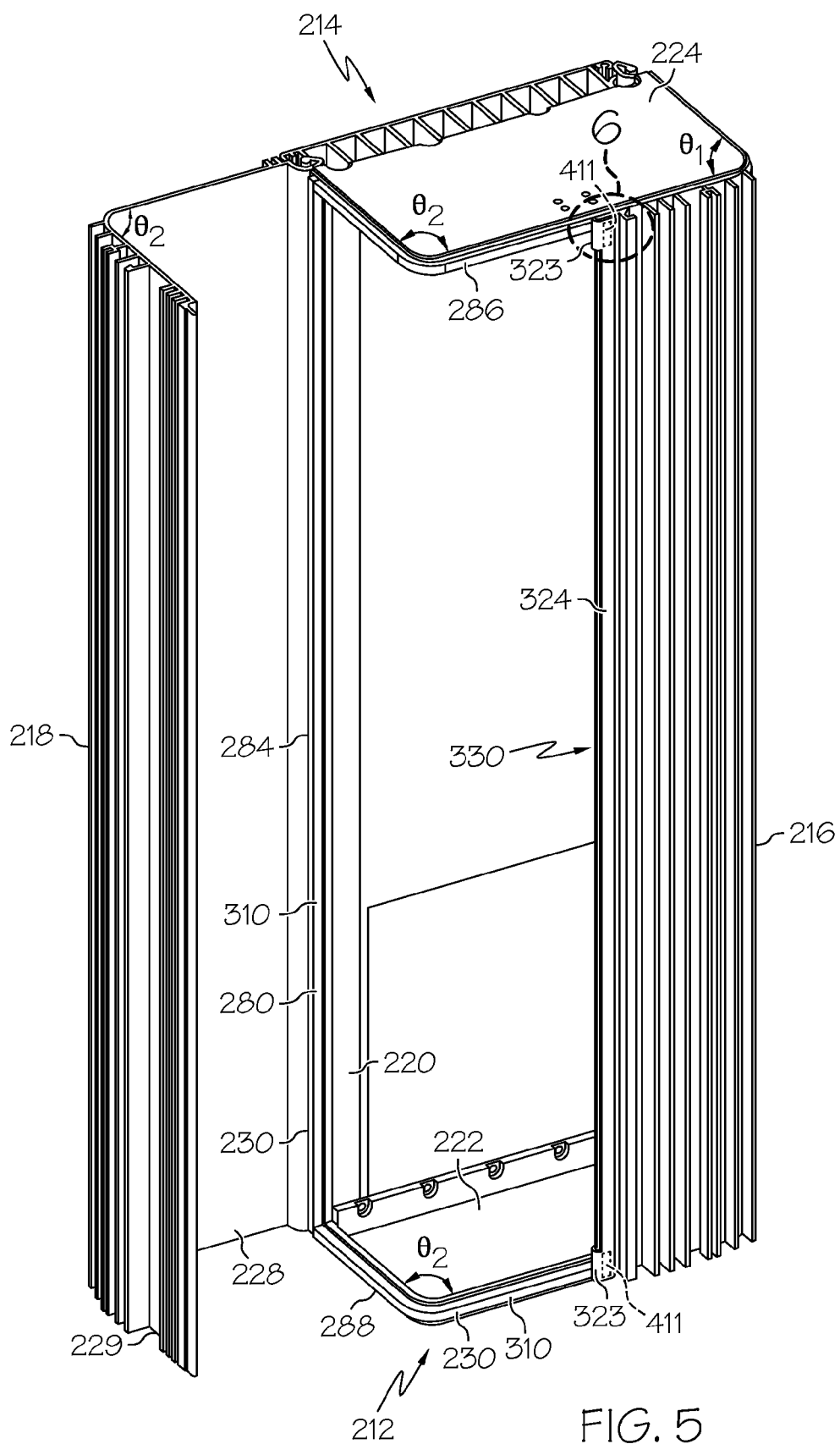
FIG. 5 is an oblique view of one embodiment of a first L-shaped door and a second L-shaped door attached to a base in a half-open position.
Figure 6:
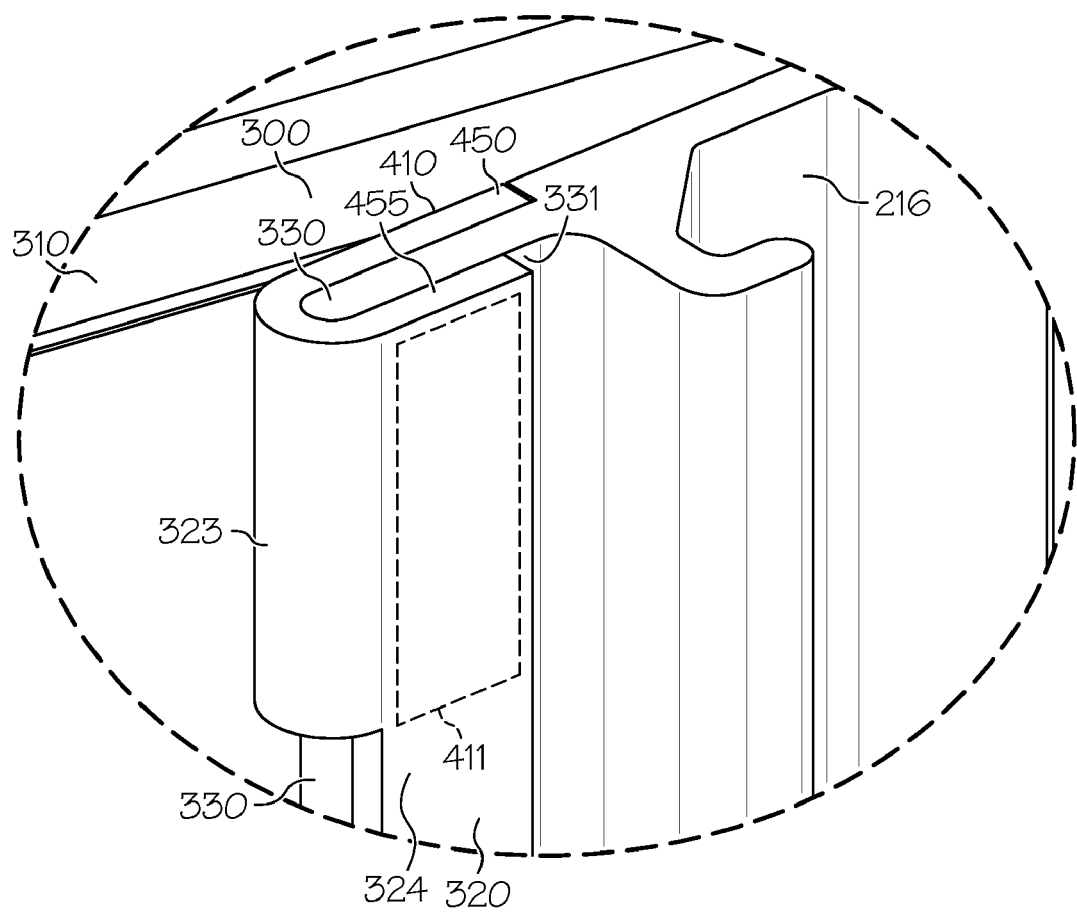
FIG. 6 is an enlarged view of a portion of the door-to-door seal of FIG. 5.

FIG. 5 is an oblique view of one embodiment of the first L-shaped door 216 and the second L-shaped door 218 attached to a base 214 in a half-open position. When the enclosure 212 is in the half-open position, the first L-shaped door 216 is in a closed position and the second L-shaped door 218 is in an open position. FIG. 6 is an enlarged view of a portion of the door-to-door seal 320 of FIG. 5. FIG. 6 shows the wrap-around-flange section 323 of the door-to-door seal 320 mated to the flange 330 when the first L-shaped door 216 is in the closed position. When the first L-shaped door 216 is in a closed position, inner portion 450 of the wrap-around-flange sections 323 contact the contacting surface 310 of the compressible base-seal 300. The outer portion 455 and the inside-door-to-door seal section 324 are not in contact with the compressible base-seal 300. The surface 411 of the outer portion 455 of the wrap-around-flange sections 323 is clearly visible in FIG. 6.

Figure 7:
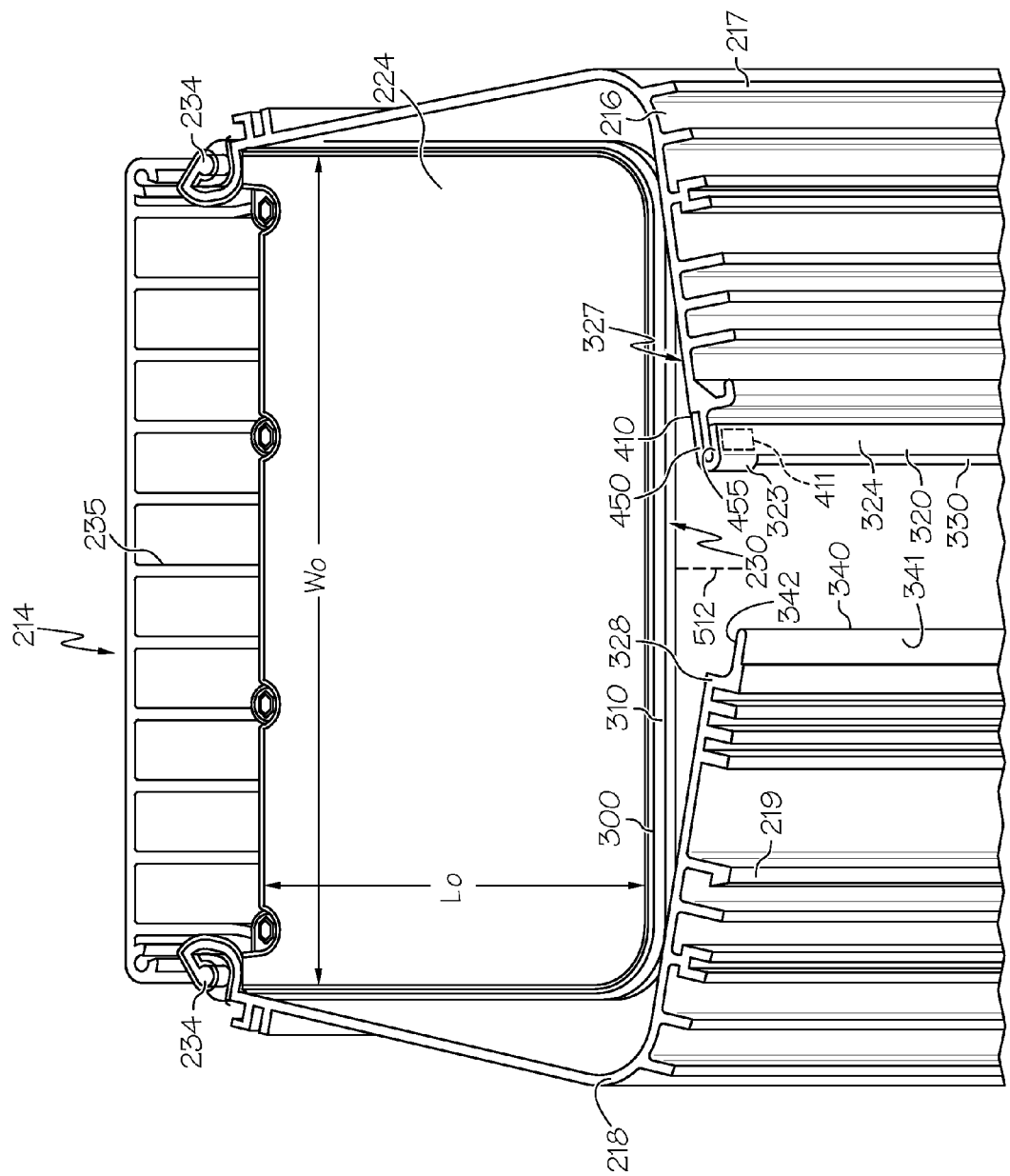
FIG. 7 is an enlarged view of the three surfaces that form a three-surface seal.

FIG. 7 is an enlarged view of the three surfaces 310, 410, and 411 that form two three-surface seals. The three surfaces for only one of the two three-surface seals is visible in FIG. 7. In order to clearly view the surfaces in FIG. 7, the first L-shaped door 216 and the second L-shaped door 218 are partially closed. When the first and second L-shaped doors 216 and 218 are being closed, first L-shaped door 216 and second L-shaped door 218 rotate about hinges 234 toward the center of base 214, which is represented generally at a dashed line labeled 512. In one implementation of this embodiment, the hinges 234 are the cam shaped hinges described in the '581 application.

The surfaces 410 (also referred to herein as "first surfaces 410"), surfaces 411 (also referred to herein as "second surfaces 411"), and contacting surface 310 form two three-surface seals between the base 214, the first L-shaped door 616, and the second L-shaped door 618 when the first L-shaped door 616 and the second L-shaped door 618 are closed. The three-surface seal provides a seal between the base 214, the first L-shaped door 216, and the second L-shaped door 218.

The surface 310 is the contacting surface 310 of the compressible seal 300 as described above with reference to FIG. 2. The surfaces 410 are the surfaces of inner portions 450 of the wrap-around-flange sections 323 that face toward the back wall 220 when the first L-shaped door 216 is closed. The surfaces 411 are the surfaces of outer portions 155 of the wrap-around-flange sections 323 that face away from the back wall 220 when the first L-shaped door 216 is closed. The second flange 340 has an inner surface 342 and an outer surface 341. The first L-shaped door 216 and second L-shaped door 218 include heat sink fins 217 and 219, respectively.

FIG. 8 is an oblique view of one embodiment of a first L-shaped door 216 and a second L-shaped door 218 attached to a base 214 in a closed position (i.e., both of the first and second L-shaped doors 216 and 218 are closed). The compressible base-seal 300 and the door-to-door seal 320 together comprise a water-resistant seal system 101 for the enclosure 212 to prevent water from entering the closed enclosure 212.

When the first L-shaped door 216 and second L-shaped door 218 are closed, the continuous compressible base-seal 300 (FIG. 2) around the exposed perimeter of base 214 (FIG. 1) is compressed between the base 214, the first L-shaped door 216, and the second L-shaped door 218. When the first L-shaped door 216 and the second L-shaped door 218 are closed, the second flange 340 overlaps the first flange 330 with the door-to-door seal 320 there between so that the door-to-door seal 320 is compressed between the first flange 330 of the first L-shaped door 216 and the second flange 340 of the second L-shaped door 218. Specifically, the inside-door-to-door seal section 324 and the outer portions 455 are compressed between the first flange 330 and the second flange 340 when the first L-shaped door 216 and the second L-shaped door 218 are closed. The inner portions 450 of the door-to-door seal 320 are between the first flange 330 and the edges 288 and 286 of the first and second endplates 224 and 222, respectively.

The three-surface seals are in the regions represented generally at 510(1-2) where the portions of the first flange 330 encased by the wrap-around-flange sections 323 are positioned between the second flange 340 and the edges 288 and 286 (FIG. 5) of the first and second endplates 224 and 222 (FIG. 5), respectively. The water-resistant and electromagnetic interference (EMI) shielded enclosure 212 is operable to enclose a plurality of electronic components so that the electronic components are unharmed by the weather in the environment of the water-resistant and EMI shielded enclosure 212.

Details about the embodiment of the enclosure 212 shown in FIGS. 1-8 are now described. As shown in FIG. 1, the first endplate 224 is attached to a top edge 514 of the back wall 220. The second endplate 222 is attached to a bottom edge 516 of the back wall 220. The first endplate 224 and the second endplate 222 have the same shape (i.e., they have the same length $L_0$ and width $W_0$ (FIG. 7).

The first L-shaped door 216 includes a section 226 and a section 227 that form an approximately 90 degree angle (represented generally at $\theta 1$) to match the approximately 90 degree angle of the rectangular shape of the second endplate 222 and first endplate 224. Likewise, the second L-shaped door 218 includes a section 228 and a section 229 that form an approximately 90 degree angle (represented generally at $\theta 2$) to match the approximately 90 degree angle of the rectangular shape of the second endplate 222 and first endplate 224. Thus, when the first L-shaped door 216 is in the closed position, the first L-shaped door 216 conforms to the half of the edge 288 of the first endplate 224 that is closer to the side edge 282 (FIG. 1) of back wall 220 and to the half of the edge 286 of the second endplate 222 that is closer to the side edge 282 of back wall 220. The first L-shaped door 216 also conforms to the side edge 282 of back wall 220. Likewise, when the second L-shaped door 218 is in the closed position, the second L-shaped door 218 conforms to the halves of the edges 288 and 286 of the first and second endplates 224 and 222 that are closer to the side edge 284 (FIG. 1) of back wall 220. The second L-shaped door 218 also conforms to the side edge 282 of back wall 220.

The door-to-door seal 320 and the continuous compressible base-seal 300 function to prevent water from entering the enclosure 212, so that the contents of the enclosure 212 (such as, electronic components) remain dry regardless of the weather conditions outside of the enclosure 212. The overlap of the second flange 340 on the first flange 330 eliminates a direct path in the seam between first L-shaped door 216 and second L-shaped door 218 through which EMI could travel. By eliminating the direct path, EMI shielding is improved since the electromagnetic radiation, which can easily leak through a narrow slot, cannot as easily leak through a slot formed by overlapping flanges. Similarly, water is unable to leak through: 1) a sealant-filled slot formed by overlapping flanges 330 and 340 with inside-door-to-door seal section 324 of the door-to-door seal 320 there between; 2) a three-surface seal at regions 510(1-2); and 3) a seal formed by the first and second end plates 224 and 222 and the first L-shaped door 216 and the second L-shaped door 218 with the compressible base-seal 300 there between.

Figure 9:
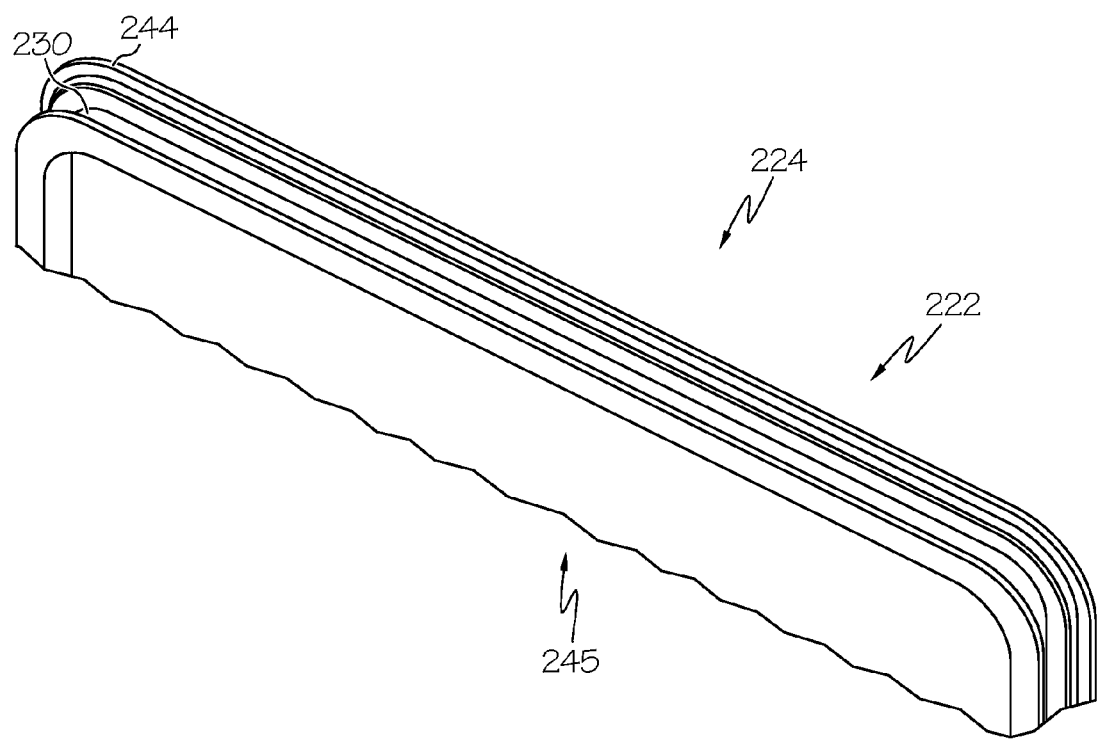
FIG. 9 is an enlarged view of one embodiment of an edge portion of endplates configured to reduce electromagnetic interference.

In one implementation of this embodiment, the first endplate 224 and the second endplate 222 are configured to reduce leaking of EMI from the top and the bottom of the enclosure 212. FIG. 9 is an enlarged view of one embodiment of an edge portion 245 of endplates configured to reduce electromagnetic interference. The enlarged view of the edge portion 245 of the first endplate 224 and second endplate 222 is shown as the same structure since they are similar in structure and function. The edge portion 245 includes the channel 230 (shown without the compressible base-seal 300 for clarity of the drawing) and a drip cap 244. The drip cap 244 includes an outer ridge, which extends to the outer sides of first L-shaped door 216 and second L-shaped door 218 when they are in the closed position. Drip cap 244, thus, provides additional protection against rain water by covering the seam between base 214 and first L-shaped door 216 and second L-shaped door 218. In addition, drip cap 244 improves EMI shielding by covering with metal the seam between base 214 and first L-shaped door 216 and second L-shaped door 218. In this way, there is no direct line for EMI to travel through the seam, which results in improved EMI shielding.

When the first L-shaped door 216 and the second L-shaped door 218, are formed from a thermally-conductive material, the first L-shaped door 216 and second L-shaped door 218 can include heat sink fins, represented generally at 217 and 219 (FIGS. 7 and 8), respectively. In addition, if the back wall 220 of the base 214 is formed from a thermo-conductive material, it can include heat sink fins represented generally at 235 (FIGS. 7 and 8).

The continuous compressible base-seal 300 and the door-to-door seal 320 are comprised of any appropriate material for providing a water-resistant seal. For example, in one embodiment, the continuous compressible base-seal 300 and the door-to-door seal 320 are comprised of an open cell foam. In another implementation of this embodiment, the continuous compressible base-seal 300 and the door-to-door seal 320 are comprised of a closed cell material. In yet another implementation of this embodiment, the continuous compressible base-seal 300 and the door-to-door seal 320 are comprised of a modified closed cell material. In yet another implementation of this embodiment, the continuous compressible base-seal 300 is comprised of separate pieces which are bonded together to form one continuous seal. In another implementation of this embodiment, the continuous compressible base-seal 300 is manufactured as one continuous piece. In yet another implementation of this embodiment, the continuous compressible base-seal 300 has a circular cross-section as shown in FIG. 2. In yet another implementation of this embodiment, continuous compressible base-seal 300 has a rectangular cross-section. In embodiments, the seal comprises of any of a plethora of different organic and inorganic elastomers including, but not limited to, rubber, plasticized rubber, polyurethane, or silicone.

In some embodiments, back wall 220, first endplate 224, and second endplate 222 are manufactured as separate segments, which are then coupled together to form base 214. In other embodiments, back wall 220, the first L-shaped door 216 and the second L-shaped door 218 are each manufactured as one continuous segment. Base 214 and the first L-shaped door 216 and the second L-shaped door 218 are comprised of any appropriate material for outdoor weather conditions including, but not limited to, plastics and metal. In particular, in this embodiment, base 214 and the first L-shaped door 216 and the second L-shaped door 218 are comprised of Aluminum.

Finally, some embodiments of the enclosure 212 reduce manufacturing costs by enabling the use of extrusion processes to manufacture the L-shaped doors and base as compared to conventional enclosures which use rigid components not conducive to extrusion processes. Extruding back wall 220, the first L-shaped door 216, and the second L-shaped door 218 enables the door and walls to be manufactured with varying lengths based on the needs of customers. In one implementation of this embodiment, the enclosures 212 are formed as described in the '547 application. In other embodiments, however, other manufacturing processes, such as die casting, are used to manufacture base 214, the first L-shaped door 216, the second L-shaped door 218, the first endplate 224, and/or the second endplate 222.

It is to be understood that embodiments of the present invention are not to be limited to L-shaped doors but can be V-shaped doors. For example, other angular aspects are possible between the section 226 and section 227 (FIG. 1) to form an approximately $\phi_1$ degree angle to match an angle $\phi_1$ of the second endplate 222 and first endplate 224. Likewise, other angular aspects are possible between the section 228 and section 229 (FIG. 1) to form an approximately $\phi_2$ degree angle to match an angle $\phi_2$ of the second endplate 222 and first endplate 224. In such an embodiment, when the first V-shaped door and the second V-shaped door are in a closed position, the base, the first V-shaped door, and the second V-shaped door form a sealed, water-resistant enclosure as is understandable from reading this document.

Hence, embodiments of the present invention enable easy access to modules located inside the electronics enclosure 212. In particular, this enables easier maintenance and installation of remote units in a distributed antenna system, such as the distributed antenna system 100 described in the '322 Application. In addition, the easy access is provided while maintaining and/or improving EMI shielding and the water-resistant seal of remote units as compared to conventional remote unit enclosures.

In one implementation of this embodiment, the compressible base-seal 300 is an o-ring. In another implementation of this embodiment, the compressible base-seal 300 is foam having at least one of a C-shaped profile, a solid round profile, a hollow round profile, a rectangular shaped profile, and a D-shaped profile. In yet another implementation of this embodiment, the compressible base seal is a die cut foam or a custom extruded foam. In yet another implementation of this embodiment, the compressible base-seal 300 is a continuous piece. In yet another implementation of this embodiment, the compressible base-seal 300 is formed from a plurality of pieces that contiguously fit together.

Figure 10:
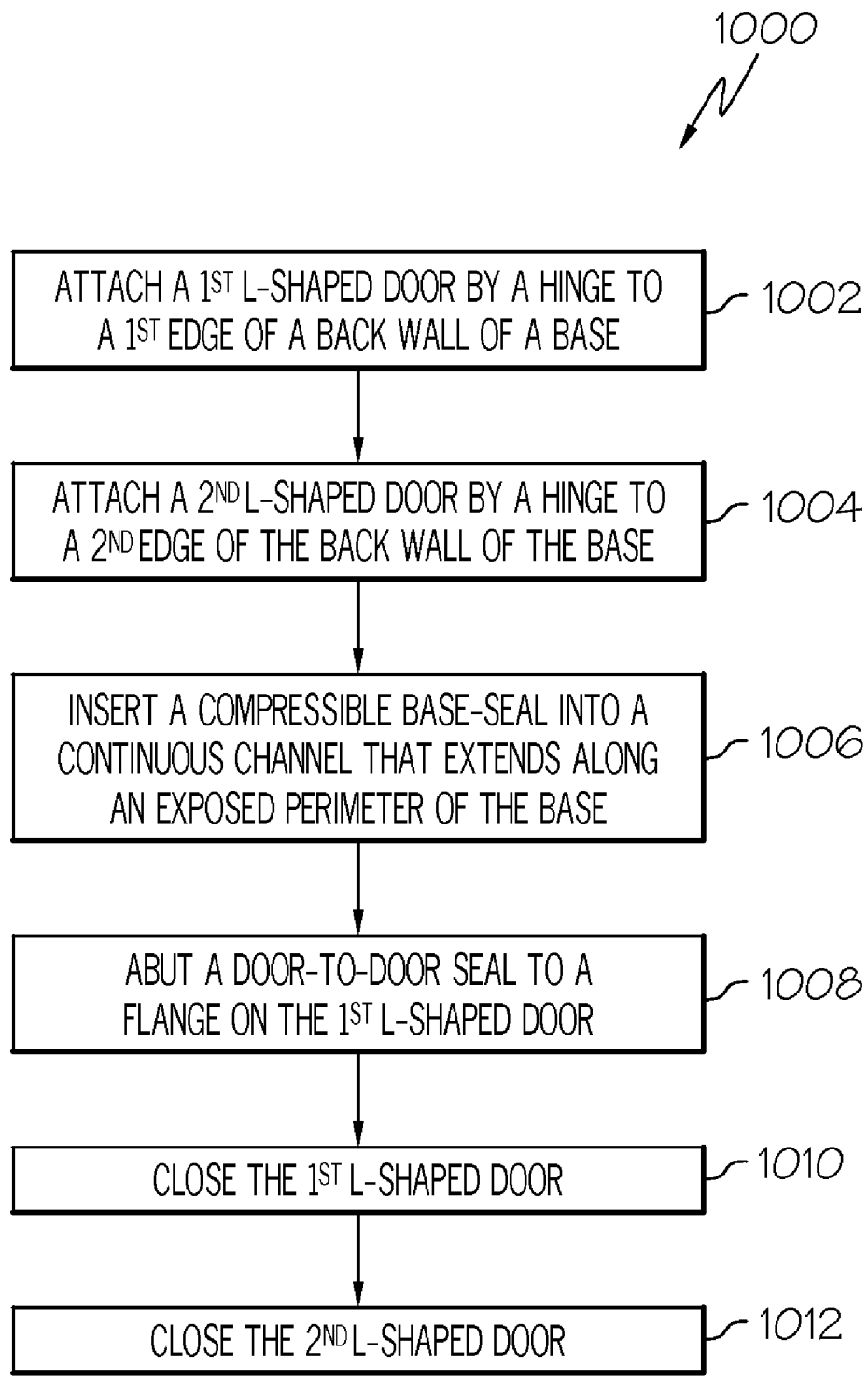
FIG. 10 is an embodiment of a method to seal an enclosure to prevent water from entering the enclosure and to reduce electromagnetic interference.

FIG. 10 is an embodiment of a method 1000 to seal an enclosure to prevent water from entering the enclosure and to reduce electromagnetic interference. Electromagnetic interference is reduced by preventing electromagnetic radiation from leaving the enclosure and by preventing electromagnetic radiation from entering the enclosure. In one implementation of this embodiment, the enclosure is the enclosure 212 as described above with reference to FIGS. 1-9. The method 1000 is described with reference to the enclosure 212 shown in FIG. 8 although it is to be understood that method 1000 can be implemented using other embodiments of the enclosures as is understandable by one skilled in the art who reads this document.

At block 1002, a first L-shaped door 216 is rotatably attached by a hinge 234 to a first side edge 282 of back wall 220 of a base 214. At block 1004, a second L-shaped door 218 is rotatably attached by a hinge 234 to a second side edge 284 of back wall 220 of the base 214.

At block 1006, a compressible base-seal 300 (FIG. 2) is inserted into a continuous channel 230 that extends along an exposed perimeter 280 of the base 214 (FIG. 1). At block 1008, a door-to-door seal 320 (FIG. 3) is abutted to a flange 330 on the first L-shaped door 216 (FIG. 4). In the embodiment illustrated in FIGS. 1-8, the two wrap-around-flange sections 323 are fitted over the first flange 330 so that the inside-door-to-door seal section 324 of the door-to-door seal 320 overlays the outer surface 331 of the first flange 330. At block 1010, the first L-shaped door 216 is closed. At block 1012, the second L-shaped door 218 is closed. When the first L-shaped door 216 and the second L-shaped door 218 are closed, inner portions 450 of the wrap-around-flange sections 323 are compressed between the compressible base-seal 300 and the flange 330 on the first L-shaped door 216 and the outer portions 455 of the wrap-around-flange sections 323 are compressed between the first flange 330 and a second flange 340 on the second first L-shaped door 218. In this manner, a three-surface seal is formed to seal an enclosure to prevent water from entering the enclosure and to reduce electromagnetic interference.

Figure 11:
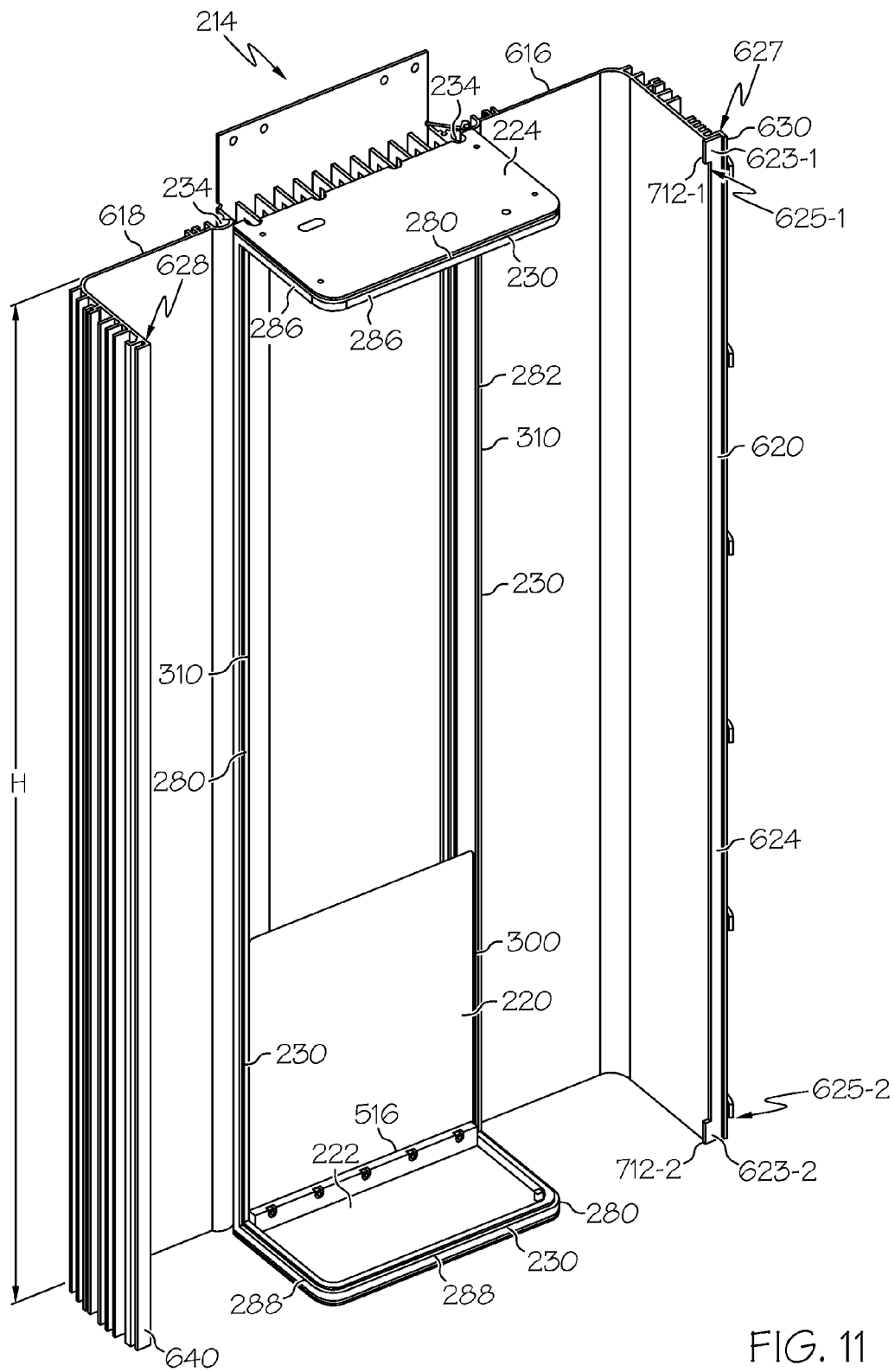
FIG. 11 is an oblique view of one embodiment of a first L-shaped door and a second L-shaped door attached to a base in an open position.
Figure 12A:
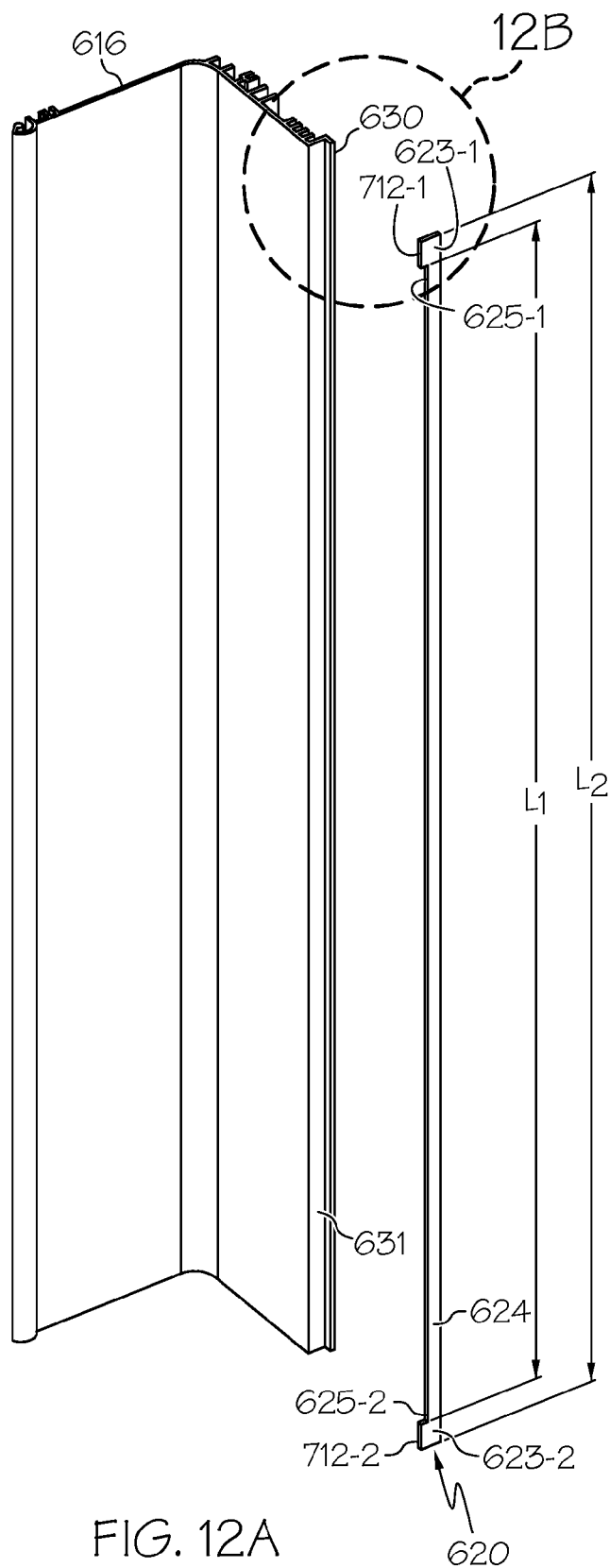
FIG. 12A is a view of one embodiment of a door-to-door seal of FIG. 11 in proximity to the first L-shaped door.
Figure 12B:
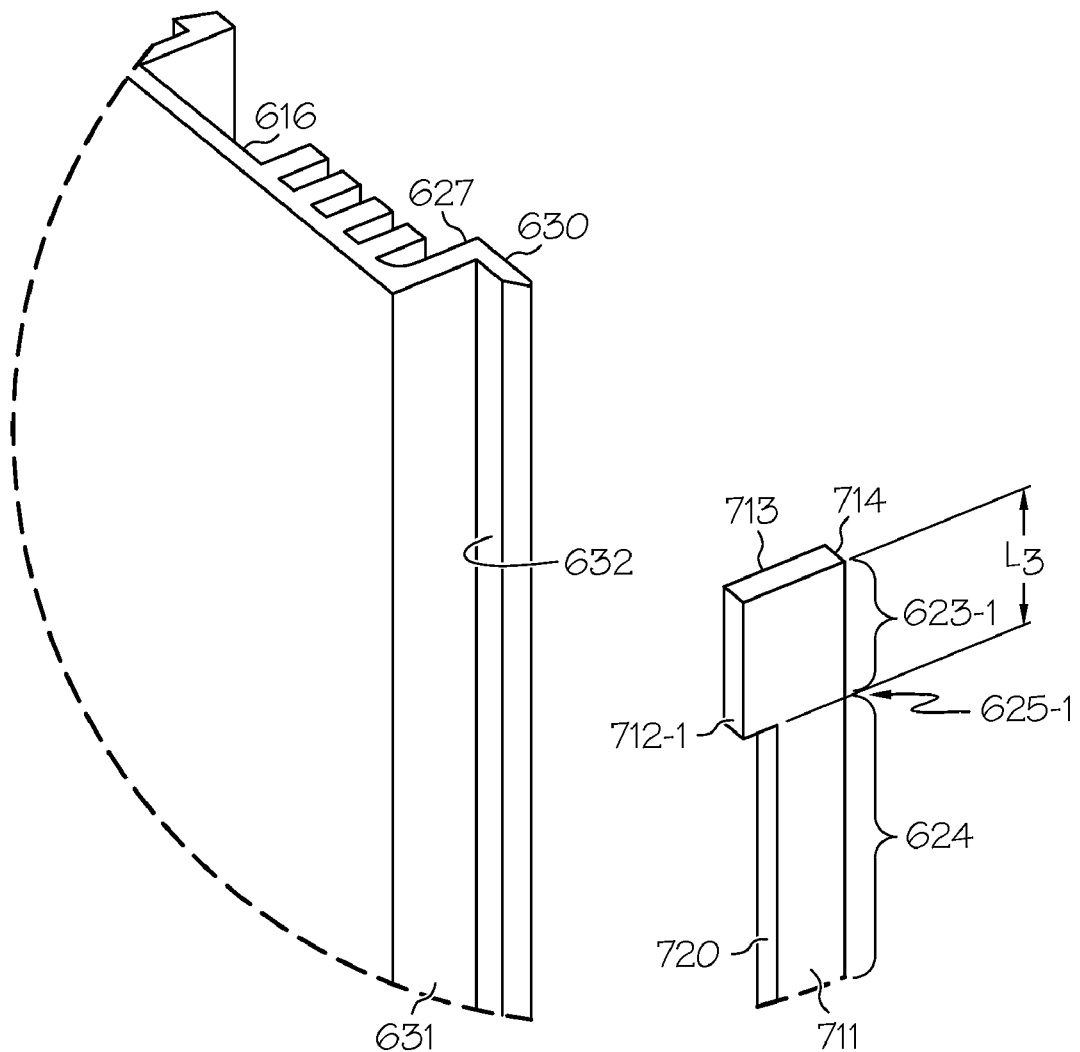
FIG. 12B is an enlarged view of a portion of the door-to-door seal of FIG. 12A.
Figure 13:
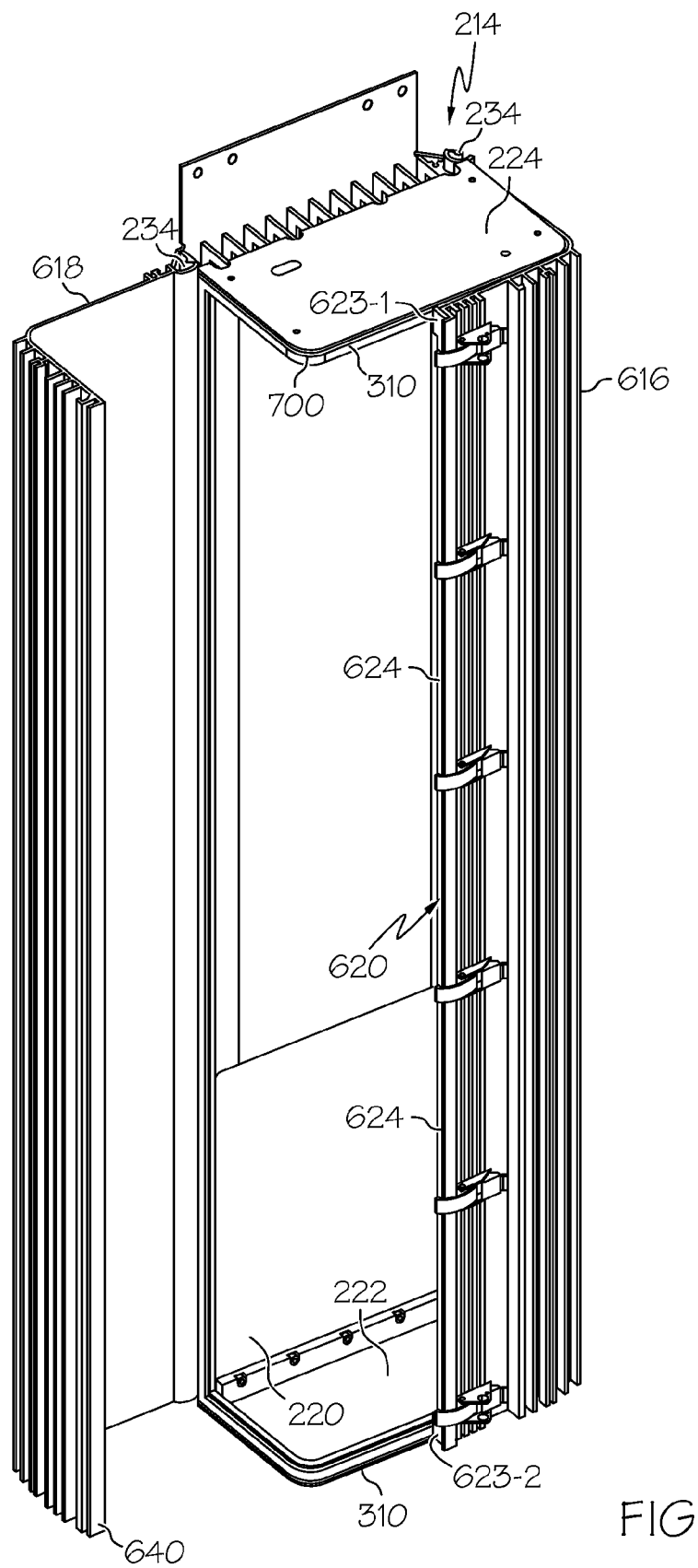
FIG. 13 is an oblique view of the first L-shaped door and the second L-shaped door of FIG. 11 in a half-open position.

FIG. 11 is an oblique view of one embodiment of a first L-shaped door 616 and a second L-shaped door 618 attached to a base 214 in an open position. As shown in FIG. 11, the door-to-door seal 620 is abutted to a flange 630 on the first L-shaped door 616. FIG. 12A is a view of one embodiment of a door-to-door seal 620 of FIG. 11 in proximity to the first L-shaped door 616. FIG. 12B is an enlarged view of a portion of the door-to-door seal 620 of FIG. 12A. FIG. 13 is an oblique view of the first L-shaped door 616 and the second L-shaped door 618 of FIG. 11 in a half-open position.

The shape of the flange 630 on the outer edge 627 of the first L-shaped door 616 differs from the flange 330 on the outer edge 327 of the first L-shaped door 216 shown in FIGS. 1 and 3-7. The shape of the door-to-door seal 620 differs from the shape of the door-to-door seal 320 shown in FIGS. 1 and 3-7. The outer edge 627 of the first L-shaped door 618 differs from the outer edge 327 of the first L-shaped door 216 shown in FIGS. 1 and 3-7. The second L-shaped door 618 includes a flat surface 640 rather than the second flange 340 shown in FIG. 7. The surface 310 is the contacting surface of the compressible seal 300 as described above with reference to FIGS. 2-8.

The door-to-door seal 620 is a long, thin, flat structure having two extended sections 623(1-2) (FIGS. 11, 12-A, and 13) at the ends 625(1-2), respectively, of an inside-door-to-door seal section 624. As shown in FIG. 12B, the door-to-door seal 620 includes a first surface 711, a second surface 720 of the inside-door-to-door seal section 624, a third surface 713, and a fourth surface 714, and extended-section surfaces 712 (1-2) (only extended-section surface 712-1 is visible in FIG. 12B) on the two extended sections 623(1-2), respectively. When the two extended sections 623(1-2) are abutted to the flange 630, each of the extended sections 623(1-2) (also referred to herein as "end sections 623(1-2)") protrudes beyond the third surface 631 at the outer edge 627 (FIG. 12B) of the first L-shaped door 616. The extended-section surfaces 712(1-2) are the surfaces of extended sections 623(1-2), respectively, that face toward the back wall 220 when the first L-shaped door 616 is closed. The extended-section surfaces 712(1-2) that protrude beyond the third surface 631 are operable to contact the contacting surface 310 of the compressible base-seal 300 when the first L-shaped door 216 is closed (FIG. 13).

The third surface 713 is attached, via glue, epoxy, or other adhesive material, to the surface 631 of the outer edge 627 of the first L-shaped door 616 so that the fourth surface 714 abuts the inner surface 632 of the flange 630 of the first L-shaped door 616. In one implementation of this embodiment, the fourth surface 714 is attached to the surface 632 of the flange 630 of the first L-shaped door 616 via some adhesive material. In another implementation of this embodiment, glue, epoxy, or other adhesive material is integrated on the third surface 713 and/or the fourth surface 714.

As shown in FIG. 13, when the first L-shaped door 616 is in a closed position, the extended-section surfaces 712(1-2) of the extended sections 623(1-2) contact the contacting surface 310 of the compressible base-seal 300.

Figure 14:
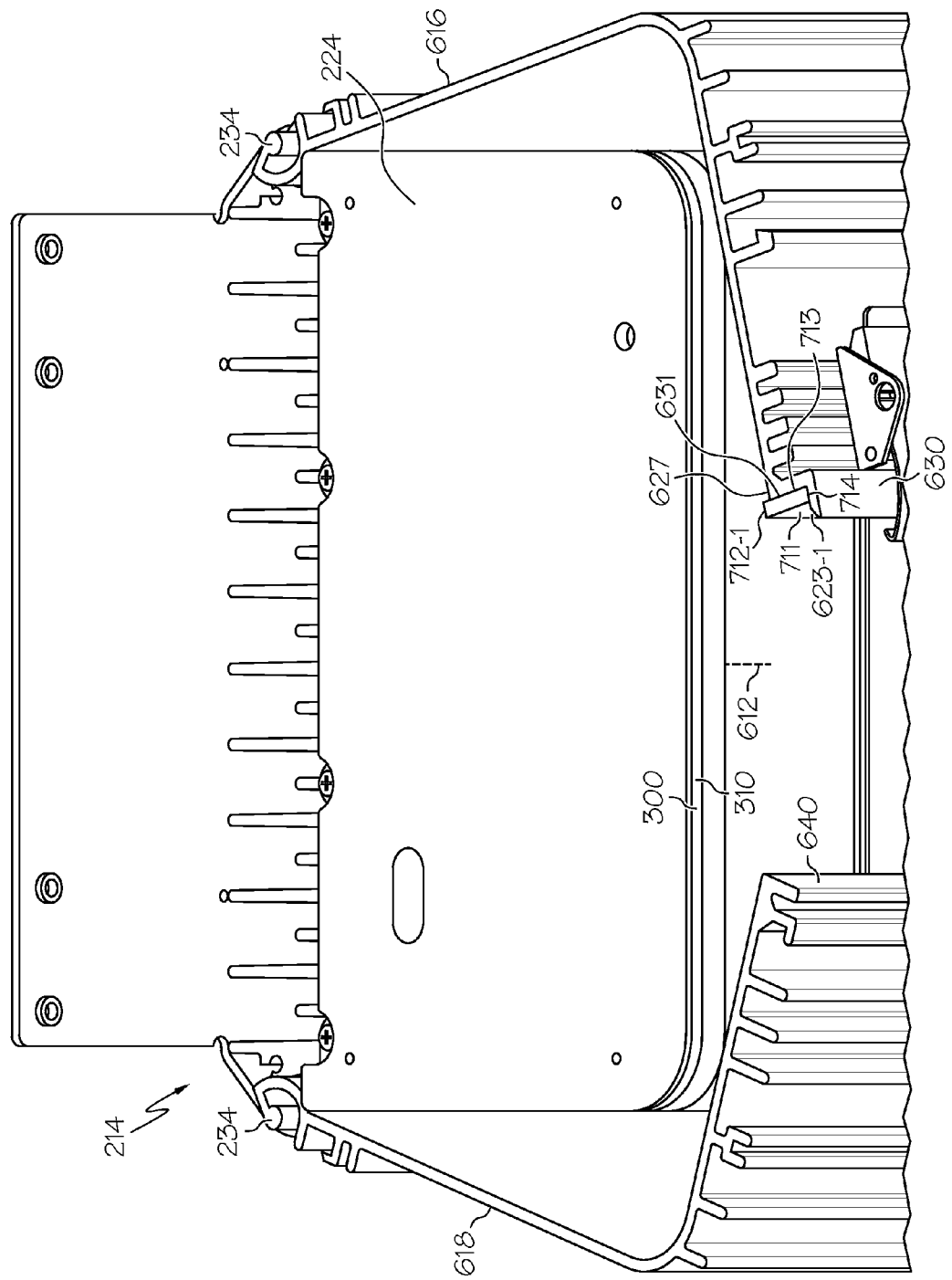
FIG. 14 is an enlarged view of the three surfaces that form a three-surface seal.

FIG. 14 is an enlarged view of the surfaces 310, 711 and 712-1 that form a three-surface seal. The surfaces 310, 711 and 712-2 also form a second three-surface seal that is not visible in FIG. 14. In order to clearly view the surfaces in FIG. 14, the first L-shaped door 616 and the second L-shaped door 618 are partially closed. When the first and second L-shaped doors 216 and 218 are being closed, first L-shaped door 616 and second L-shaped door 618 rotate about hinges 234 toward the center of base 214, which is represented generally at a dashed line labeled 612.

The surface 711, extended-section surfaces 712(1-2) (only extended-section surface 712-1 is visible in FIG. 14) and contacting surface 310 form two three-surface seals between the base 214, the first L-shaped door 616, and the second L-shaped door 618 when the first L-shaped door 616 and the second L-shaped door 618 are closed. The three-surface seal provides a seal between the base 214, the first L-shaped door 616, and the second L-shaped door 618. The surface 711 (also referred to herein as "second surface 711") is the surface of the door-to-door seal 620 that contacts the surface 640 of the second L-shaped door 618 when the first L-shaped door 616 and the second L-shaped door 618 are closed to form part of the three-surface seal. The surfaces 712(1-2) contact the contacting surface 310 to form the other part of two three-surface seals. The first L-shaped door 616 and second L-shaped door 618 include heat sink fins 217 and 219, respectively.

The door-to-door seal 620 is comprised of any appropriate seal material for providing a water-resistant seal. For example, in one embodiment, the door-to-door seal 620 is comprised of an open cell foam, a closed cell material, or a modified closed cell material. In embodiments, the seal comprises of any of a plethora of different organic and inorganic elastomers including, but not limited to rubber, plasticized rubber, polyurethane or silicone.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A water-resistant and electromagnetic interference shielded enclosure configured to enclose a plurality of electronic components, the enclosure comprising:
    a base having a channel;
    a first L-shaped door rotatably attached to a first side edge of the base;
    a second L-shaped door rotatably attached to a second side edge of the base;
    a door-to-door seal abutted to a flange on the first L-shaped door, the door-to-door seal having an inside-door-to-door seal section, and two wrap-around-flange sections at ends of the inside-door-to-door seal section, wherein each wrap-around-flange section has an inner portion and an outer portion; and
    a compressible base-seal inserted into the channel, wherein the compressible base-seal and the door-to-door seal form a three-surface seal when the first L-shaped door and the second L-shaped door are closed.

2. The enclosure of claim 1, wherein the three-surface seal comprises:
    a contacting surface of the compressible base-seal;
    at least one first surface of the door-to-door seal; and
    at least one second surface of the door-to-door seal.

3. The enclosure of claim 1, wherein the flange on the first L-shaped door is a first flange, and wherein, when the first L-shaped door and the second L-shaped door are closed,
    the inside-door-to-door seal section is compressed between the first flange and a second flange on the second L-shaped door,
    the compressible base-seal is compressed between the second L-shaped door and the base, and
    the compressible base-seal is compressed between the first L-shaped door and the base.

4. The enclosure of claim 1, wherein the flange on the first L-shaped door is a first flange, and wherein the three-surface seal comprises:
    a contacting surface of the compressible base-seal;
    first surfaces of inner portions of the wrap-around flange sections contacting the contacting surface of the compressible base-seal; and
    second surfaces of outer portions of the wrap-around flange sections contacting a second flange on the second L-shaped door.

5. The enclosure of claim 4, wherein, when the first L-shaped door and the second L-shaped door are closed, the compressible base-seal around an exposed perimeter of base is compressed between the base, the first L-shaped door, and the second L-shaped door, and wherein the inside-door-to-door seal section is compressed between the first flange and the second flange.

6. The enclosure of claim 1, wherein the base comprises:
    a back wall having the first and second side edges in which portions of the channel are formed;

a first endplate attached to a top edge of the back wall and having an exposed perimeter in which another portion of the channel is formed; and a second endplate attached to a bottom edge of the back wall and having an exposed perimeter in which yet another portion of the channel is formed, wherein the first endplate and the second endplate have a same length and a same width.

7. The enclosure of claim 6, wherein the flange on the first L-shaped door is a first flange, wherein the second L-shaped door includes a second flange, wherein the second flange overlaps the first flange so that a portion of the first flange is positioned between a respective portion of the second flange and a respective portion of the edge of the first endplate and, while another portion of the first flange is positioned between another respective portion of the second flange and a respective portion of the edge of the second endplate.

8. The enclosure of claim 6, wherein at least one of the first endplate and the second endplate includes a drip cap.

9. The enclosure of claim 1, wherein the door-to-door seal extends a length of the first L-shaped door.

10. The enclosure of claim 1, wherein the compressible base-seal is an o-ring.

11. The enclosure of claim 1, wherein the compressible base-seal comprises at least one of foam having a C-shaped profile, foam having a solid round profile, foam having a hollow round profile, foam having a rectangular shaped profile, foam having a D-shaped profile, a die cut foam, and a custom extruded foam.

12. The enclosure of claim 1, wherein the door-to-door seal comprises:
two end-sections; and
an inside-door-to-door seal section.

13. The enclosure of claim 12, wherein the flange on the first L-shaped door is a first flange, and wherein each of the end-sections is a wrap-around-flange section having an inner portion and an outer portion, so that when the doors are closed;
the inner portions of the wrap-around-flange sections are compressed between the compressible base-seal and the flange on the first L-shaped door, and
the outer portions of the wrap-around-flange sections are compressed between the first flange and a second flange on the second L-shaped door, wherein the three-surface seals are in the regions where the first flange is between the second flange and edges of first and second endplates.

14. A method to seal an enclosure to prevent water from entering the enclosure and to reduce electromagnetic interference, the method comprising:
attaching a first L-shaped door by a hinge to a first side edge of a back wall of a base;
attaching a second L-shaped door by a hinge to a second side edge of the back wall of the base;
inserting a compressible base-seal into a continuous channel formed along an exposed perimeter of the base; and
abutting a door-to-door seal, which includes an inside-door-to-door seal section and two wrap-around-flange sections at ends of the inside-door-to-door seal section, to a flange on the first L-shaped door by fitting the two wrap-around-flange sections over the flange, so that the inside-door-to-door seal section overlays an outer surface of the flange.

15. The method of claim 14, the method further comprising:
closing the first L-shaped door; and
closing the second L-shaped door.

16. The method of claim 15, the method further comprising:
compressing inner portions of the wrap-around-flange sections between the compressible base-seal and the flange on the first L-shaped door; and
compressing outer portions of the wrap-around-flange sections between the first flange and a second flange on the second L-shaped door, wherein a three-surface seal is formed.

17. A water-resistant seal system for an enclosure, the water-resistant seal system comprising:
a compressible base-seal inserted into a continuous channel of a base of an enclosure; and
a door-to-door seal abutted to a flange on an L-shaped door rotatably attached to the base, wherein the door-to-door seal comprises:
an inside-door-to-door seal section; and
two wrap-around-flange sections at the ends of the inside-door-to-door seal section, wherein the first L-shaped door has a flange, wherein the two wrap-around-flange sections wrap around opposing ends of the flange, wherein water is prevented from entering the closed enclosure.

18. The water-resistant seal system of claim 17, wherein the L-shaped door is a first L-shaped door, wherein the first L-shaped door and a second L-shaped door are closed to compress the door-to-door seal between the first L-shaped door and the second L-shaped door, and wherein the door-to-door seal compresses the compressible base-seal inserted into the continuous channel of the base.

19. The water-resistant seal system of claim 17, wherein the flange is a first flange, and wherein the base includes a first endplate, a second endplate, and a back wall, wherein the first L-shaped door closes to contact inner portions of the wrap-around-flange sections against respective portions of the compressible base-seal inserted into the continuous channel in the first endplate and the second endplate, and wherein the second L-shaped door closes so that outer portions of the of the wrap-around-flange sections and the inside-door-to-door seal section are pressed between a second flange on the second L-shaped door and the first flange.

* * * * *